United States Patent [19]

Suzuki

[11] Patent Number: 5,923,201
[45] Date of Patent: Jul. 13, 1999

[54] CLOCK SIGNAL GENERATING CIRCUIT

[75] Inventor: Hideyuki Suzuki, Yamagata, Japan

[73] Assignee: NEC Corporation, Japan

[21] Appl. No.: 08/938,642

[22] Filed: Sep. 26, 1997

[30] Foreign Application Priority Data

Sep. 27, 1996 [JP] Japan .................................. 8-256915

[51] Int. Cl.[6] .............................. G06F 1/04; H03K 3/00
[52] U.S. Cl. .................... 327/291; 327/166; 331/116 FE
[58] Field of Search ........................ 331/74, 75, 116 R,
331/116 FE; 327/291, 292, 299, 165, 166

[56] References Cited

U.S. PATENT DOCUMENTS

| | | | |
|---|---|---|---|
| 4,039,973 | 8/1977 | Yamashiro | 331/116 R |
| 4,322,694 | 3/1982 | Morihisa | 331/116 FE |
| 4,746,810 | 5/1988 | Takahashi | 307/106 |
| 4,864,255 | 9/1989 | Yoshida | 331/75 |
| 5,187,453 | 2/1993 | Aoyagi et al. | 331/116 FE |

FOREIGN PATENT DOCUMENTS 63-67822  3/1988  Japan .

*Primary Examiner*—Timothy P. Callahan
*Assistant Examiner*—An T. Luu
*Attorney, Agent, or Firm*—Ostrolenk, Faber, Gerb & Soffen, LLP

[57] ABSTRACT

A clock signal generating circuit of the present invention switches the threshold value of a buffer circuit included in an output buffer section substantially when the oscillation output of an oscillating section is stabilized, thereby generating a clock signal. The clock signal plays the role of a clock signal for a stabilization detecting circuit at the same time. Therefore, once the oscillation is stabilized, clock components other than a clock signal whose duty cycle is 50% and which would bring about noise are obviated. This allows the clock signal output from the clock signal generating circuit to remain stable.

3 Claims, 6 Drawing Sheets

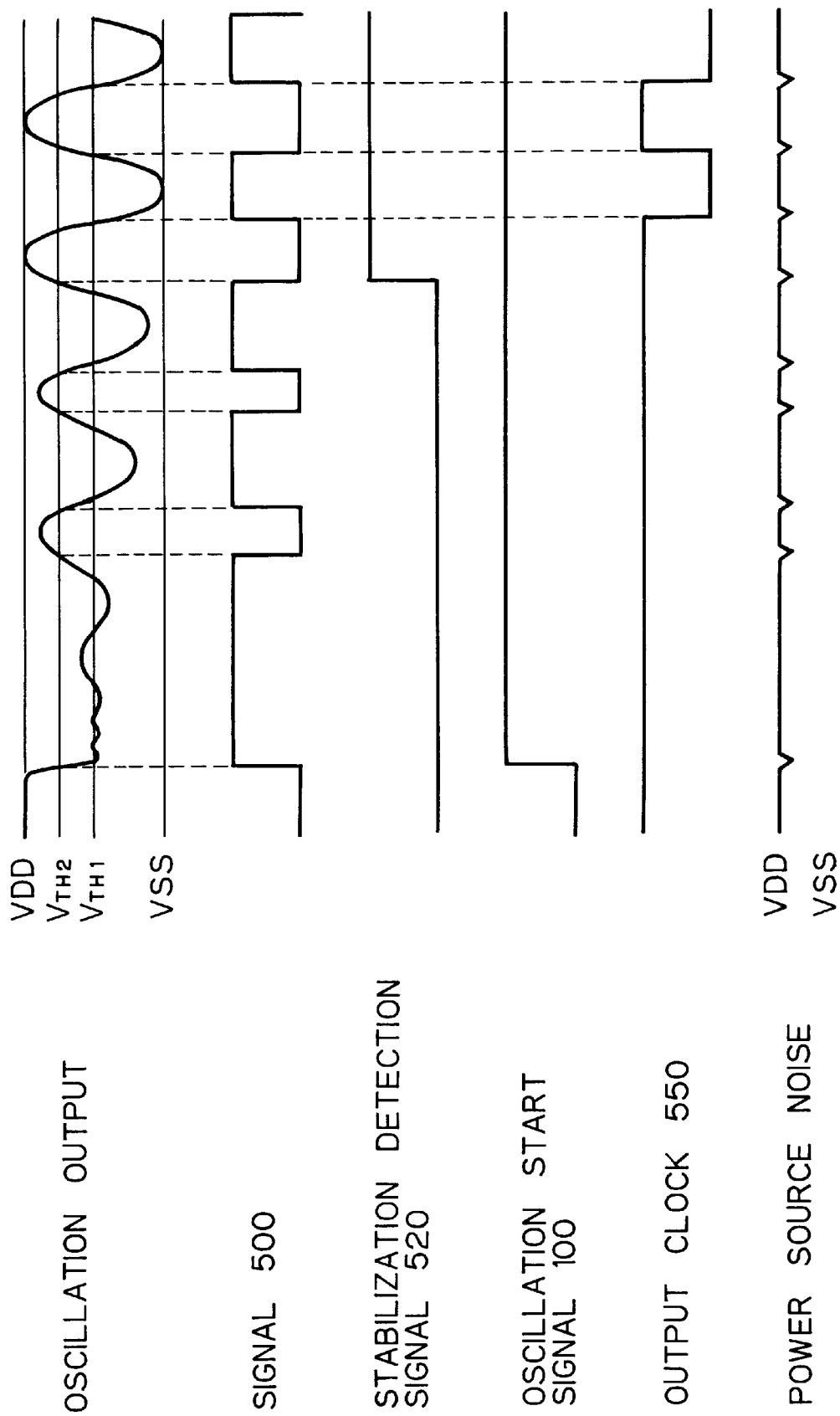

CLOCK SIGNAL GENERATING CIRCUIT

BACKGROUND OF THE INVENTION

The present invention relates to a clock signal generating circuit for digital circuitry included in, e.g., a microcomputer and, more particularly, to a clock signal generating circuit for generating a rectangular clock signal whose duty cycle is 50%.

The problem with a conventional a clock signal generating circuit is that both a clock buffer section for a stabilization detecting section and an output buffer section included in the circuit output clock signals. Particularly, the clock buffer section continuously outputs a clock signal even after oscillation has been stabilized. The clock signal output from the clock buffer section is apt to turn out noise in a clock signal whose duty cycle is 50%.

Technologies relating to the present invention are disclosed in, e.g., Japanese Patent Laid-Open Publication No. 63-67822.

SUMMARY OF THE INVENTION

It is therefore an object of the present invention to provide a clock signal generating circuit for digital circuitry built in, e.g., a microcomputer and capable of generating a clock signal with a minimum of noise ascribable to undesirable clock components.

A clock signal generating circuit of the present invention includes an oscillating section including a piezoelectric oscillator as an oscillation source. A stabilization detecting section outputs a detection signal when the voltage of the oscillation output of the oscillating section exceeds a first threshold value a preselected number of times, determining that the oscillation output has been stabilized. An output buffer section sets up, in response to the detection signal, the first threshold value when the detection signal is inactive or sets up a second threshold value when the detection signal is active, thereby generating a clock signal. A controller selectively renders the clock signal active or inactive in response to the detection signal output from the stabilization detecting section. The clock signal is applied to the stabilization detecting section as a clock signal at the same time.

BRIEF DESCRIPTION OF THE DRAWINGS

The above and other objects, features and advantages of the present invention will become apparent from the following detailed description taken with the accompanying drawings in which:

FIG. 6 is a timing chart representative of a specific operation of the embodiment shown in FIG. 5.

Figure 1:
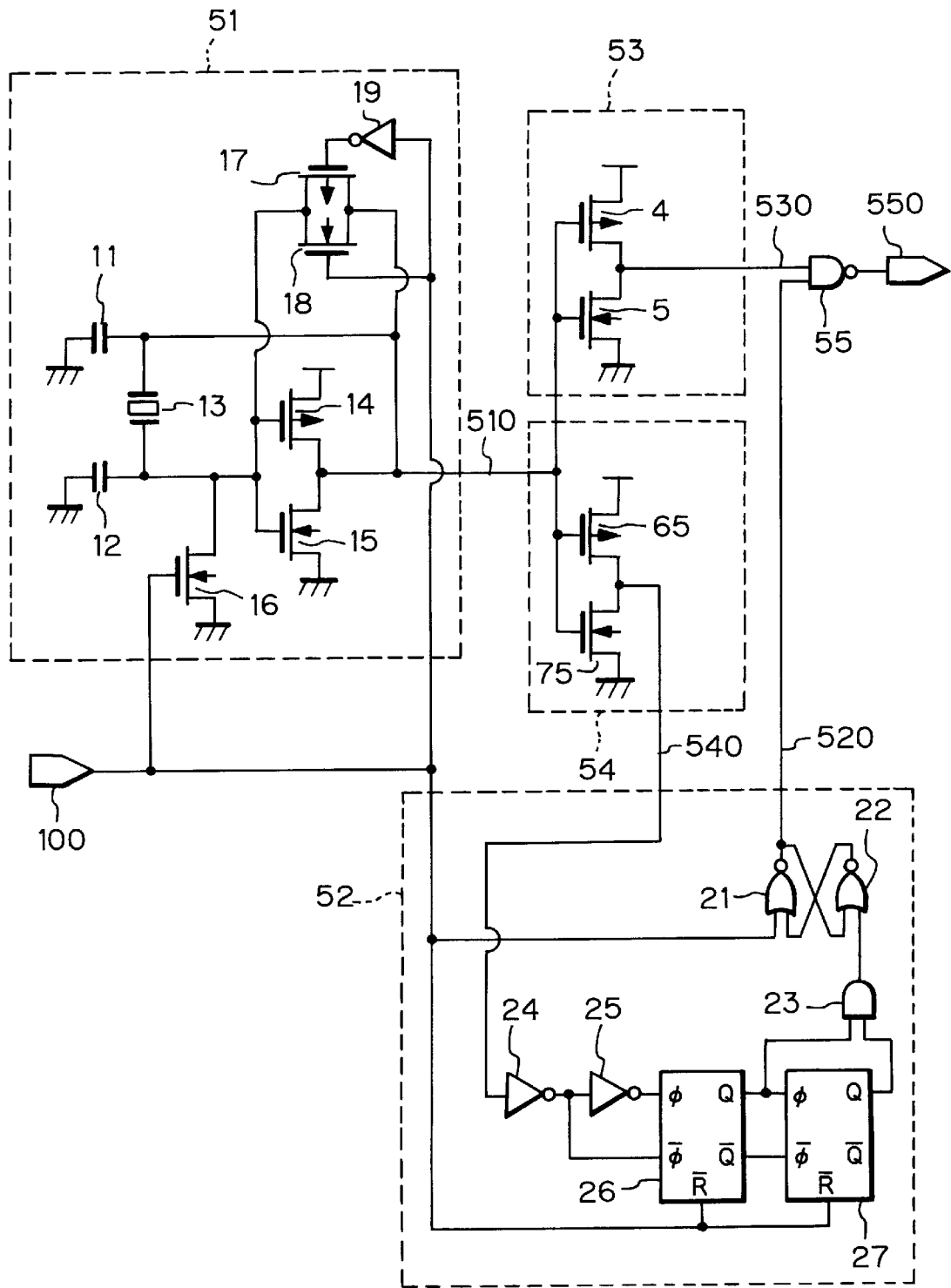
FIG. 1 is a block diagram schematically showing a conventional clock signal generating circuit.

In the drawings, identical references denote identical structural elements.

DESCRIPTION OF THE PREFERRED EMBODIMENTS

To better understand the present invention, brief reference will be made to a conventional clock signal generating circuit for use in, e.g., a microcomputer, shown in FIG. 1. As shown, the circuit includes an oscillating section 51, a section 52 for detecting the stabilization of oscillation, an output buffer section 53, a clock buffer section 54 for the section 52, and a NAND gate 55. The oscillating section 51 includes an oscillation source implemented by a piezoelectric oscillator. The NAND gate 55 NANDs the outputs 530 and 520 of the above sections 53 and 52, respectively, and inverts the resulting NAND. The output of the NAND gate 55 is fed out as a rectangular clock signal 550 having a duty cycle of 50%.

The output 510 of the oscillating section 51 is fed to the output buffer section 53 implemented by a CMOS (Complementary Metal Oxide Semiconductor) inverter circuit, i.e., a P type transistor 4 and an N type transistor 5. The output 510 of the oscillating section 51 is also fed to the clock buffer section 54. The clock buffer section 54 is a CMOS inverter circuit also made up of a P type transistor 65 and an N type transistor 75. The CMOS inverter of the output buffer section has a threshold voltage Vt53 equal to the threshold voltage of an output buffer included in the oscillating section 51 and about on-half of a power source voltage VDD. The CMOS inverter of the clock buffer section 54 has a threshold voltage Vt54 substantially between the threshold voltage Vt53 and the power source voltage VDD.

A specific configuration of the oscillating section 51 and that of the stabilization detecting section 52 will not be described because they are identical with sections 51 and 52 included in an illustrative embodiment of the present invention to be described later.

Figure 2:
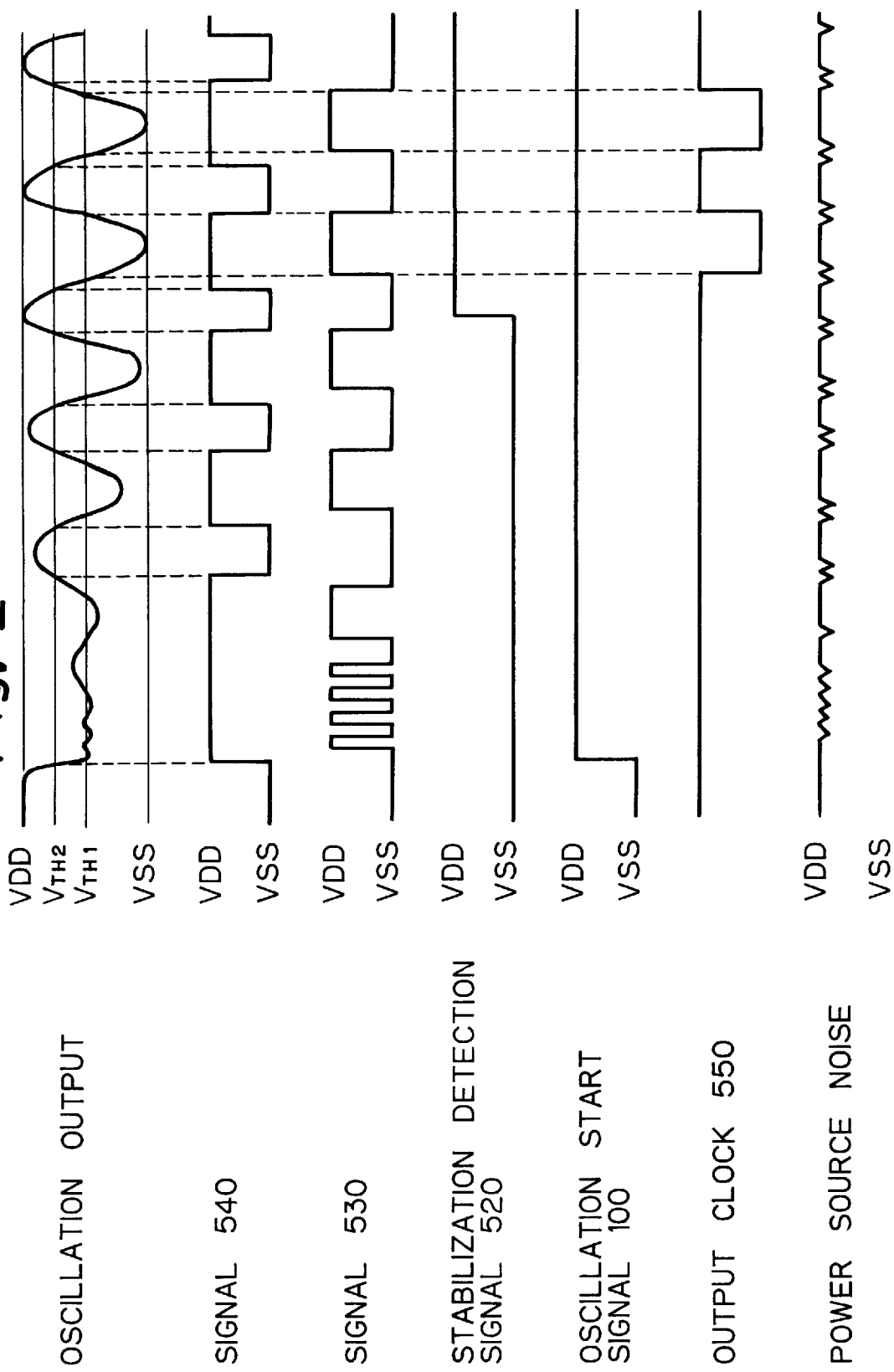
FIG. 2 is a timing chart demonstrating a specific operation of the conventional circuit shown in FIG. 1.

FIG. 2 shows specific waveforms of signals appearing in the circuit shown in FIG. 1. The operation of the conventional circuit will be described with reference to FIGS. 1 and 2.

When an oscillation start signal 100 changed from a low level to a high level (active), the oscillating section 51 starts oscillating. In the initial stage, however, the oscillation of the oscillating section 51 is unstable. The oscillation sequentially grows at both sides of a voltage which is one-half of the power source voltage VDD, until it becomes stable. At this instant, a signal 540 fed from the clock buffer section 54 to the stabilization detecting section 52 varies as illustrated. On receiving three clock pulses 540 from the clock buffer section 54, the stabilization detecting section 52 renders its output signal 520 active, i.e., changes it from a low level to a high level. In response to the signal 520, the NAND gate 55 delivers the output signal 530 of the output buffer section 53 to the clock signal output 550.

With the above configuration, the conventional circuit produces a clock signal having a duty cycle of 50% while cancelling noise occurring in the initial stage of oscillation. However, both the clock buffer section 54 and output buffer section 53 output clock signals. Particularly, the clock buffer section 54 continuously outputs its clock signal 540 even after the oscillation has been stabilized. The clock signal 540 is apt to turn out noise in the clock signal whose duty cycle is 50%, as stated earlier.

Figure 3:
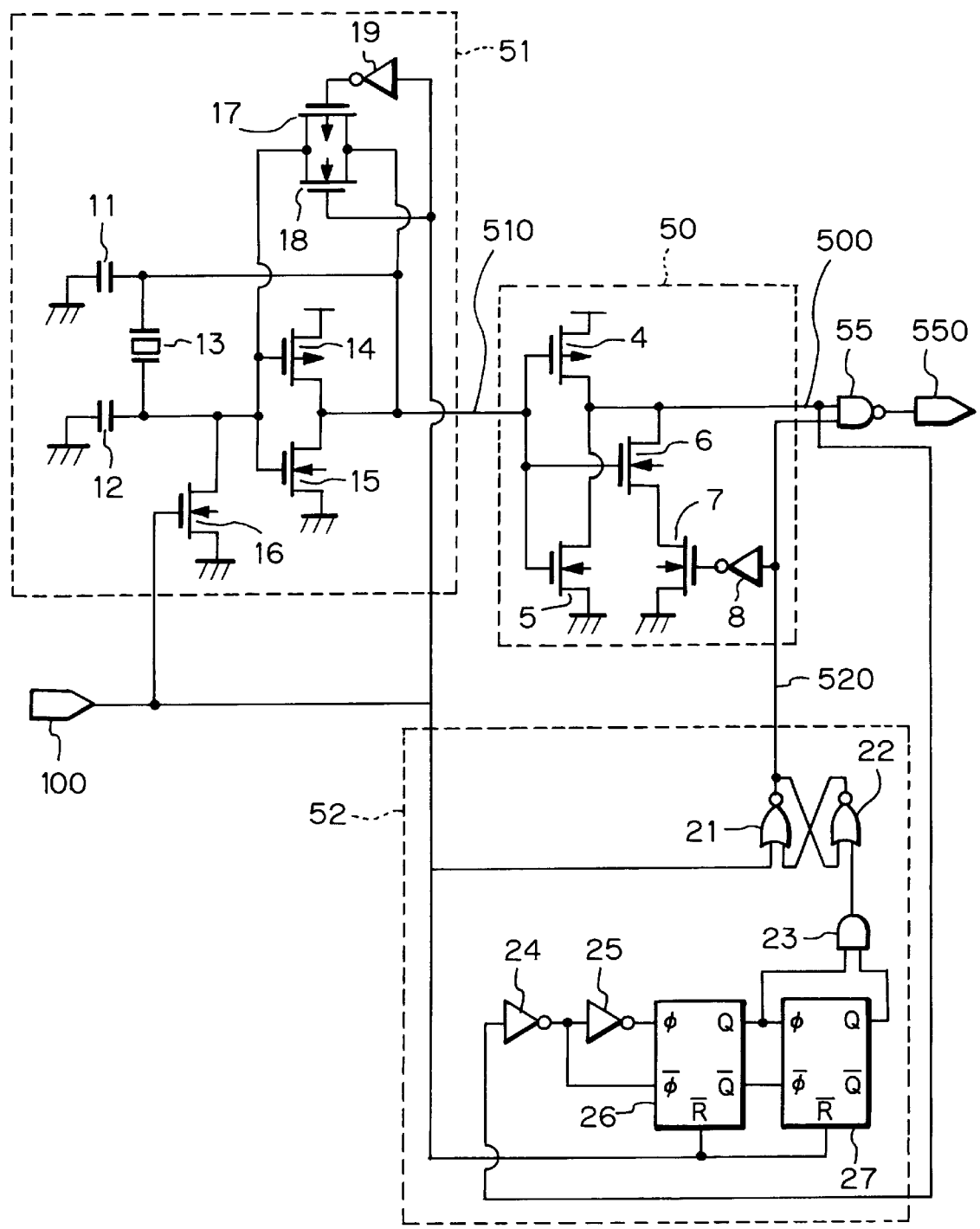
FIG. 3 is a block diagram schematically showing a clock signal generating circuit embodying the present invention.

Referring to FIG. 3, a clock generating circuit embodying the present invention will be described. As shown, the circuit includes an oscillating section 51 receiving an oscillation start signal 100 and outputting an oscillation signal 510. An output buffer section 50 includes a P type transistor 4 and N type transistor 5, 6 and 7. The P type transistor 4 receives the oscillation signal 510 at its gate and receives a power source voltage VDD at its source. The N type transistor 5 receives the oscillation signal 510 at its gate and has its source connected to ground. The N type transistor 6 receives the oscillation signal 510 at its gate and has its source connected to the drain of the N type transistor 7. An inverter 8 receives the output signal 520 of a stabilization detecting section 52 which will be described. The N type transistor 7 receives the output signal of the inverter 8 and has its source and drain connected to ground and the source of the transistor 6, respectively. The output buffer section 50 outputs a signal 500 which is a signal appearing on the common drain of the transistors 4, 5 and 6. In the output buffer section 50, the P type transistor 4 and N type transistor 5 constitute a CMOS inverter circuit.

The stabilization detecting section 52 receives the output signal 500 of the output buffer section 50 and the oscillation start signal 100. A NAND gate 55 receives the output signal 500 of the output buffer section 500 and outputs a clock signal 550.

The oscillating section 51 includes a CMOS inverter circuit made up of an N type transistor 16 receiving the oscillation start signal 100 at its gate and having its source connected to ground, a P type transistor 14 having its gate connected to the drain of the transistor 16 and receiving the power source voltage VDD at its source, and an N type transistor 15 having its gate and source connected to the drain of the transistor 16 and ground, respectively. The CMOS inverter circuit of the oscillating section 51 outputs the oscillation signal 510 which is a signal appearing on the common drain of the transistors 14 and 15. A feedback resistance circuit has an N type transistor 18 receiving the oscillation start signal 100 at its gate, and a P type transistor 17 receiving the output of an inverter 19 to which the signal 100 is input. The common source of the transistors 17 and 18 and the common drain of the transistors 14 and 15 are connected together. The common drain of the transistors 17 and 18 is connected to the gates of the transistors 14 and 15. An oscillator 13 is connected in parallel with the feedback resistance circuit. Capacitors 11 and 12 are respectively connected to opposite ends of the oscillator 13 at one end and connected to ground at the other end.

The stabilization detecting section 52 includes an inverter 24 to which the signal 500 is applied. An inverter 25 receives the output of the inverter 24. A flip-flop 26 receives the output signals of the inverters 24 and 25 at its clock terminals $\bar{\phi}$ and $\phi$, respectively, and receives the oscillation start signal 100 at its reset terminal R. A flip-flop 27 receives the Q and $\bar{Q}$ outputs of the flip-flop 26 at its clock terminals $\phi$ and $\bar{\phi}$, respectively, and receives the oscillation start signal at its reset terminal R. An AND gage 23 ANDs the output signals of the flip-flops 26 and 27. A NOR gate 22 receives the output signal of the AND gate 23 and the output signal of a NOR gate 21. A NOR gate 21 receives the output signal of the NOR gate 22 and the oscillation start signal 100. The output signal of the NOR gate 21 appears on the output 520 of the stabilization detecting section 52.

Figure 4:
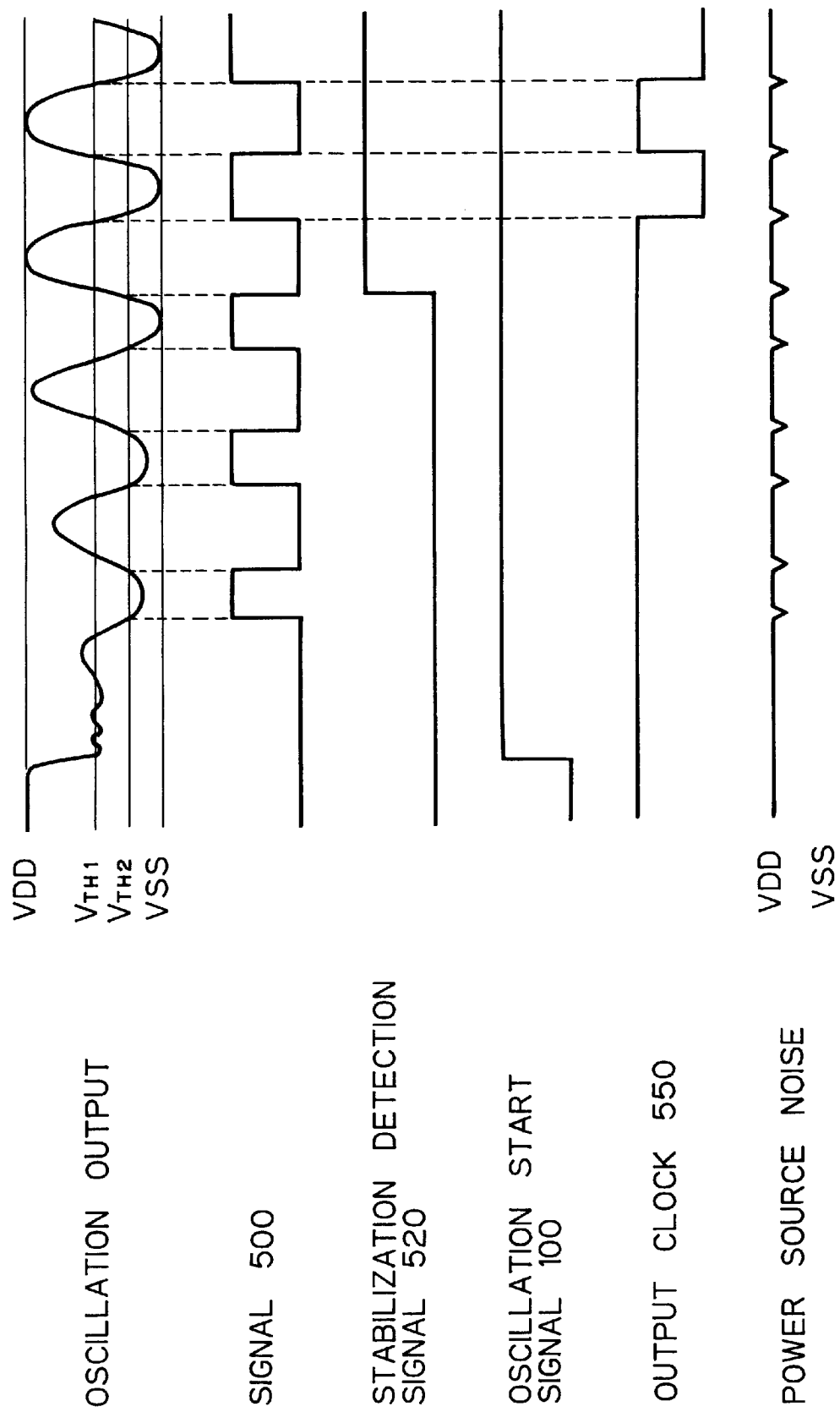
FIG. 4 is a timing chart representative of a specific operation of the embodiment shown in FIG. 3.

A specific operation of the above embodiment will be described with reference to FIGS. 3 and 4. In FIG. 4, a voltage VSS is representative of a ground potential. When the oscillation start signal 100 is equal to the voltage VSS, the feedback resistance circuit included in the oscillating section 51 and made up of the transistors 17 and 18 turns off, preventing the section 51 from oscillating. When the oscillation start signal 100 rises to a voltage VDD, the feedback resistance circuit turns on with the result that the oscillating section 51 starts oscillating with the resonance frequency of the oscillator 13. As shown in FIG. 4, the output signal 510 of the oscillating section 51 sequentially grows from a small amplitude at both sides of the threshold value $V_{TH1}$ of the CMOS inverter circuit made up of the transistors 14 and 15. At this stage of operation, the frequency of the signal 510 is likely to exceed the preselected frequency; a microcomputer operated by such a clock would crash. The threshold value $V_{TH1}$ is selected to be ($\frac{1}{2}$)VDD, considering the accuracy of the oscillation frequency. So long as the signal 520 output from the stabilization detecting circuit 52 is VSS, the N type transistor 7 turns on and validates the N type transistor 6. Therefore, the threshold value of the output buffer 50 is switched to $V_{TH2}$ lower than ($\frac{1}{2}$)VDD. When the amplitude of the signal 510 is stabilized and reaches the threshold value $V_{TH2}$, the output buffer 50 outputs the pulse signal 500. On receiving three clock pulses 500 from the output buffer 50, the stabilization detecting section 52 switches its output signal 520 from the voltage VSS to the voltage VDD, determining that the oscillation has been sufficiently stabilized.

When the signal 520 is switched from the voltage VSS to the voltage VDD, the N type transistor 7 turns off, invalidating the gate width of the N type transistor 6. As a result, the threshold value of the output buffer section 50 is switched to $V_{TH1}$ and provides the pulse signal 500 with a duty ratio of 50%. The NAND gate 55 operates in response to the signal or control signal 520. When the signal 520 becomes VDD, the output clock 550 outputs a pulse. Power source noise is ascribable to a piercing current which flows at the positive- and negative-going edges of pulses. As shown in FIG. 4, the illustrative embodiment causes a minimum of power source noise to occur, compared to the conventional power source noise of FIG. 2, because the embodiment is free from pulses which are different in width.

Figure 5:
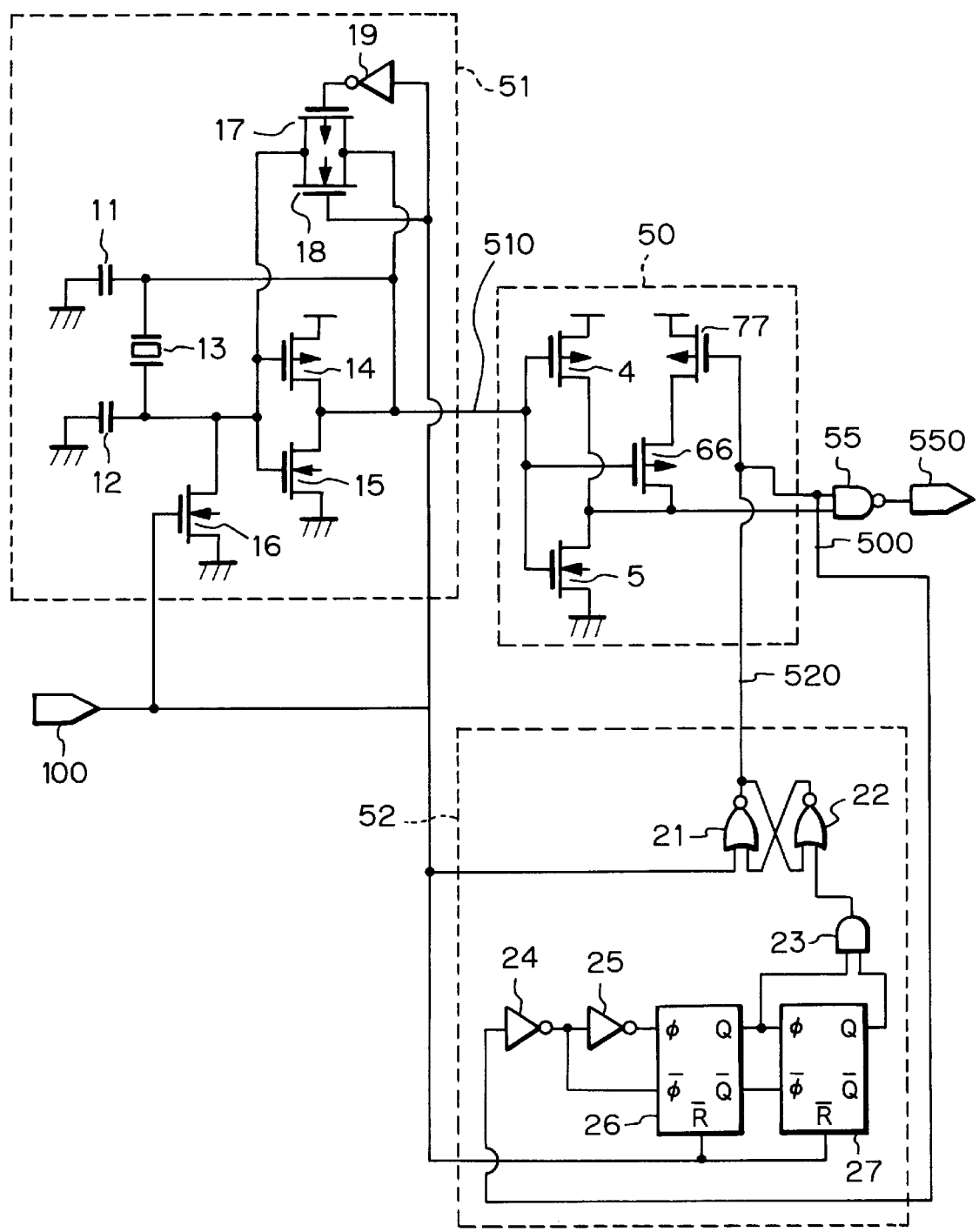
FIG. 5 is a schematic block diagram showing an alternative embodiment of the present invention.

FIGS. 5 and 6 show an alternative embodiment of the present invention. This embodiment is similar to the previous embodiment except for the configuration of the output buffer section 50. As shown, a P type transistor 77 included in the output buffer 50 is controlled by the output signal 520 of the stabilization detecting circuit 52 so as to selectively validate or invalidate a P type transistor 66 also included in the output buffer section 50. As a result, the threshold value of the output buffer section 50 is switched in the same manner as in the previous embodiment. Specifically, as shown in FIG. 6, when the signal 520 is VSS, the threshold value of the output buffer section 50 is $V_{TH2}$ higher than the threshold value of the oscillating section 5. When the signal 520 is VDD, the threshold value of the output buffer 50 is $V_{TH1}$ equal to the threshold value of the oscillating section 51, causing a clock signal having a duty ratio of 50% to appear.

In summary, in accordance with the present invention, a clock signal generating circuit switches the threshold value of a buffer circuit included in an output buffer section substantially when the oscillation output of an oscillating section is stabilized, thereby generating a clock signal. The clock signal plays the role of a clock signal for a stabilization detecting circuit at the same time. Therefore, once the oscillation is stabilized, clock components other than a clock signal whose duty cycle is 50% and which would bring about noise are obviated. This allows the clock signal output from the clock signal generating circuit to remain stable.

Various modifications will become possible for those skilled in the art after receiving the teachings of the present disclosure without departing from the scope thereof.

What is claimed is:

1. A clock signal generating circuit for generating a clock signal, comprising:

an oscillating section including a piezoelectric oscillator as an oscillation source;

a stabilization detecting section for outputting a detection signal when a voltage of an oscillation output of said oscillating section exceeds a first threshold value a preselected number of times, determining that said oscillation output has been stabilized;

an output buffer section for setting up, in response to said detection signal, said first threshold value when said detection signal is inactive or setting up a second threshold value when said detection signal is active; and a controller selectively rendering said clock signal active or inactive in response to said detection signal output from said stabilization detecting section.

2. A circuit as claimed in claim 1, wherein said output buffer section comprises a CMOS inverter circuit constituted by a P type first transistor and an N type second transistor, and an N type third transistor of a same size as said first and second transistors and connected with said first and second transistors, and an N type fourth transistor connected to a source of said third transistor and selectively turned on or turned off by said detection signal, said third transistor being active only when said detection signal is inactive, thereby setting up said first threshold value.

3. A circuit as claimed in claim 1, wherein said output buffer section comprises a CMOS inverter circuit constituted by a P type first transistor and an N type second transistor, a P type third transistor of a same size as said first and second transistors and connected with said first and second transistors, and a P type fourth transistor connected to a drain of said third transistor and selectively turned on or turned off by said detection signal, said third transistor being active only when said detection signal is active, thereby setting up said first threshold value.

\* \* \* \* \*